(12) United States Patent
Liu

(10) Patent No.: US 9,704,802 B2
(45) Date of Patent: Jul. 11, 2017

(54) INTEGRATED CIRCUIT STRUCTURES COMPRISING CONDUCTIVE VIAS AND METHODS OF FORMING CONDUCTIVE VIAS

(71) Applicant: Micron Technology, Inc., Boise, ID (US)

(72) Inventor: Zengtao T. Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/838,738

(22) Filed: Aug. 28, 2015

(65) Prior Publication Data

US 2017/0062338 A1    Mar. 2, 2017

(51) Int. Cl.
*H01L 23/528* (2006.01)
*H01L 23/522* (2006.01)
*H01L 27/24* (2006.01)
*H01L 21/768* (2006.01)

(52) U.S. Cl.
CPC ...... *H01L 23/5283* (2013.01); *H01L 21/7684* (2013.01); *H01L 21/76816* (2013.01); *H01L 21/76834* (2013.01); *H01L 21/76843* (2013.01); *H01L 21/76877* (2013.01); *H01L 23/5226* (2013.01); *H01L 27/2463* (2013.01)

(58) Field of Classification Search
None
See application file for complete search history.

(56) References Cited

U.S. PATENT DOCUMENTS 9,412,940 B2 *   8/2016  Sacchetto  .......... G11C 13/0007
2016/0071803 A1 *  3/2016  Saito  ................ H01L 23/53276
                                                                  257/746

* cited by examiner

*Primary Examiner* — Whitney T Moore
(74) *Attorney, Agent, or Firm* — Wells St. John, P.S.

(57) ABSTRACT

A method of forming conductive vias comprises forming a first via opening and a second via opening within a substrate. First conductive material of a first conductivity is formed into the first and second via openings. The first conductive material lines sidewalls and a base of the second via opening to less-than-fill the second via opening. Second conductive material is formed into the second via opening over the first conductive material in the second via opening. The second conductive material is of a second conductivity that is greater than the first conductivity. All conductive material within the first via opening forms a first conductive via defining a first maximum conductance elevationally through the first conductive via and all conductive material within the second via opening forms a second conductive via defining a second maximum conductance elevationally through the second conductive via that is greater than said first maximum conductance. Integrated circuit structure comprising conductive vias independent of method of manufacture are disclosed.

14 Claims, 5 Drawing Sheets

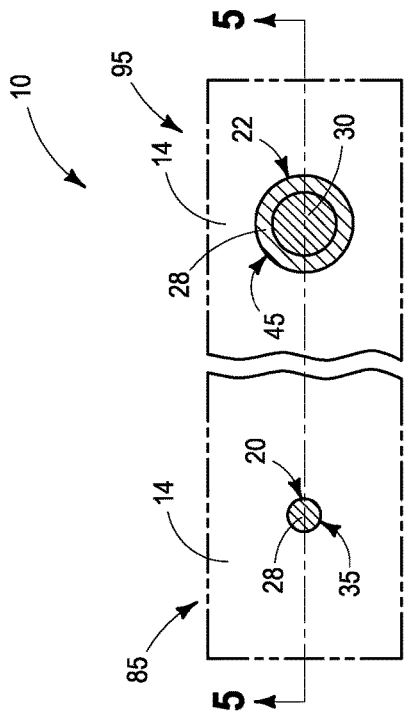
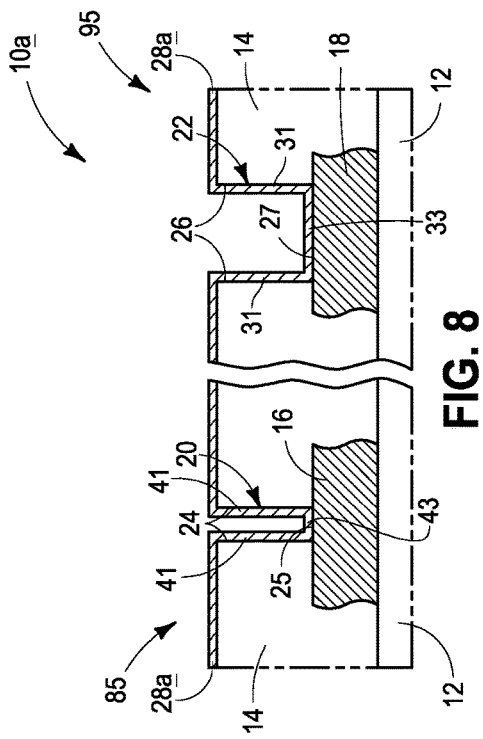
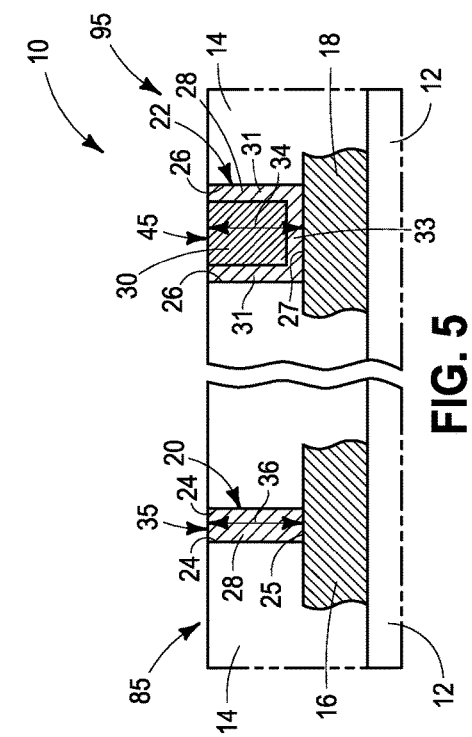
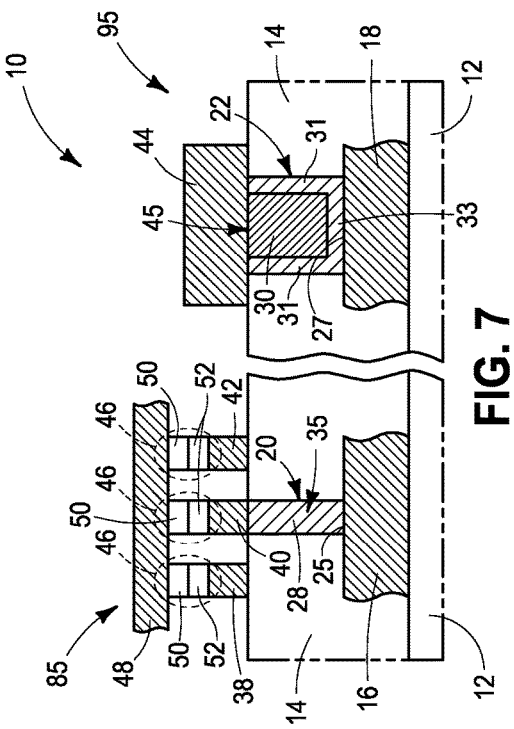

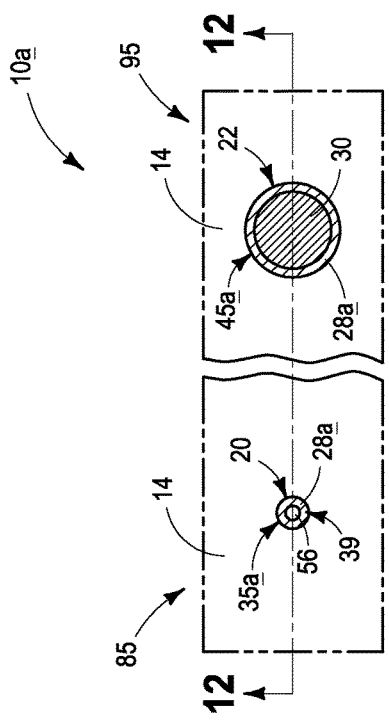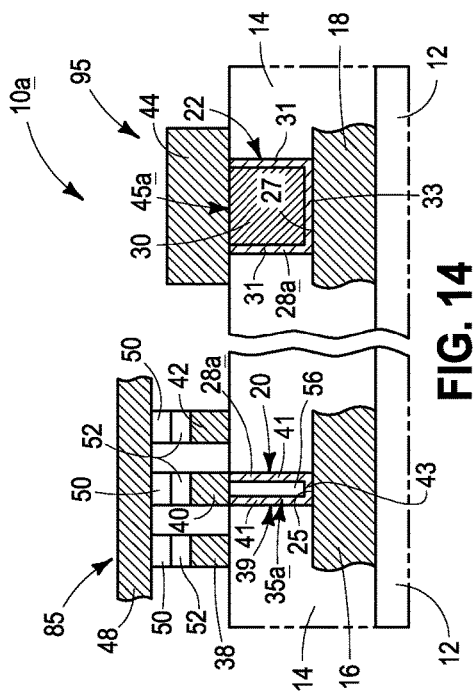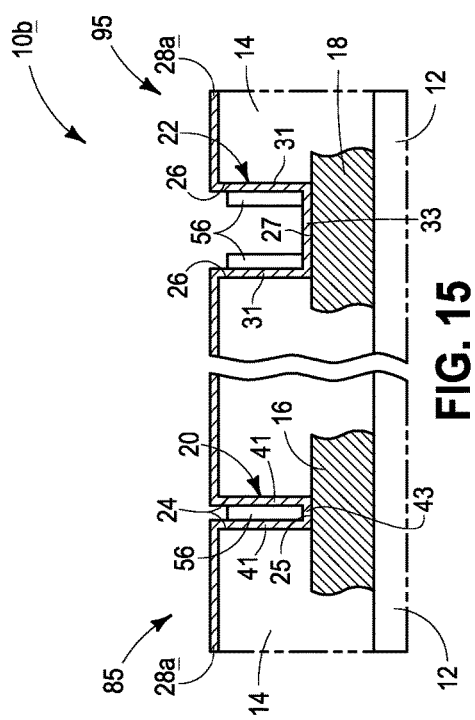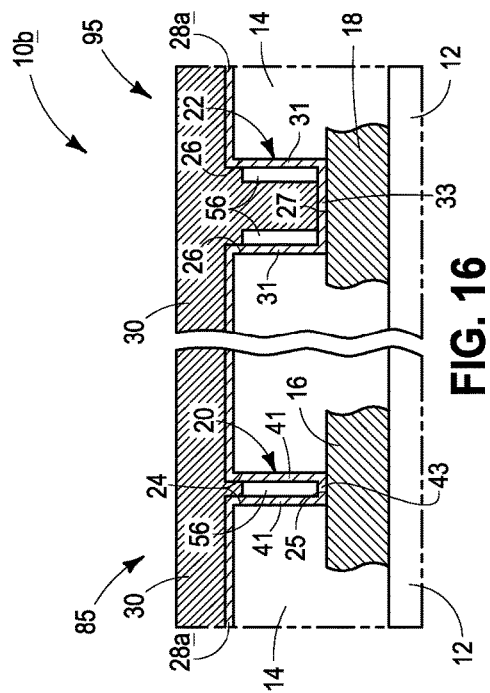

US 9,704,802 B2

INTEGRATED CIRCUIT STRUCTURES COMPRISING CONDUCTIVE VIAS AND METHODS OF FORMING CONDUCTIVE VIAS

TECHNICAL FIELD

Embodiments disclosed herein pertain to integrated circuit structures comprising conductive vias and to methods of forming conductive vias.

BACKGROUND

A continuing goal in integrated circuitry fabrication is to make ever smaller and closer packed circuit components. As integrated circuitry density has increased, there is often greater reduction in the horizontal dimension of circuit components as compared to the vertical dimension. In many instances, the vertical dimension has increased. As size decreases and density increases, there is a continuing challenge to provide sufficient conductive contact area between electrically coupled circuit components particularly where that coupling is through contacting surfaces that are substantially horizontal. For example, elevationally elongated conductive vias formed in contact/via openings are commonly used for electrically coupling circuit components that are at different elevations relative to one another.

Memory is one type of integrated circuitry commonly incorporating conductive vias. Integrated memory is fabricated in one or more arrays of individual memory cells. The memory cells might be volatile, semi-volatile, or nonvolatile. Nonvolatile memory cells can store data for extended periods of time in the absence of power. Nonvolatile memory is conventionally specified to be memory having a retention time of at least about 10 years. Volatile memory dissipates, and is therefore refreshed/rewritten to maintain data storage. Volatile memory may have a retention time of milliseconds or less. The memory cells are configured to retain or store memory in at least two different selectable states. In a binary system, the states are considered as either a "0" or a "1". In other systems, at least some individual memory cells may be configured to store more than two levels or states of information.

The smallest and simplest memory cell will likely be comprised of two electrodes having a programmable material, and possibly a select device (such as a diode or ovonic threshold switch), received between them. Suitable programmable materials have two or more selectable memory states to enable storing of information by an individual memory cell. The reading of the cell comprises determination of which of the states the programmable material is in, and the writing of information to the cell places the programmable material in a predetermined state. Some programmable materials retain a memory state in the absence of refresh, and thus may be incorporated into nonvolatile memory cells.

Arrays of memory cells may comprise a plurality of access lines at one elevation and a plurality of sense lines at another elevation. Programmable material and a select device may be provided between such lines where they cross. Individual memory cells can be written to or read from by application of suitable voltage and/or current to the respective crossing access line and sense line. A conductive via may be provided to each access line and to each sense line to apply such voltage and/or current to the selected lines. Only one conductive via is commonly fabricated for each line, although multiple conductive vias may be provided to electrically couple to the same line. Regardless, a memory cell closest to a conductive via experiences less resistance to current flow than does, for example, a memory cell hundreds or thousands of memory cells down the particular conductive line from that conductive via. This can be problematic, particularly during certain write operations where, for example, a memory cell closest to the via receives too much current.

BRIEF DESCRIPTION OF THE DRAWINGS

FIG. 5 is a view of the FIG. 4 substrate at a processing step subsequent to that shown by FIG. 4, and is taken through line 5-5 in FIG. 6.

FIG. 6 is a top view of FIG. 5.

FIG. 7 is a view of the FIG. 5 substrate at a processing step subsequent to that shown by FIGS. 5 and 6.

FIG. 8 is a diagrammatic sectional view of a substrate fragment in process in accordance with an embodiment of the invention.

FIG. 13 is atop view of FIG. 12.

FIG. 14 is a view of the FIG. 12 substrate at a processing step subsequent to that shown by FIGS. 12 and 13.

FIG. 15 is a diagrammatic sectional view of a substrate fragment in process in accordance with an embodiment of the invention.

FIG. 16 is a view of the FIG. 15 substrate at a processing step subsequent to that shown by FIG. 15.

DETAILED DESCRIPTION OF EXAMPLE EMBODIMENTS

Embodiments of the invention encompass methods of forming conductive vias and integrated circuit structures comprising conductive vias independent of method of manufacture.

Figure 2:
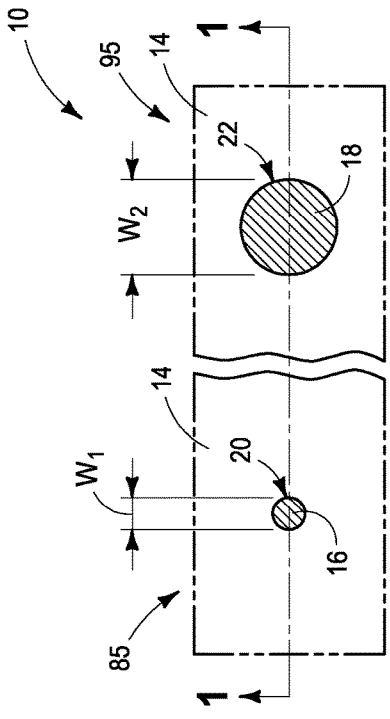
FIG. 2 is a top view of FIG. 1.
Figure 1:
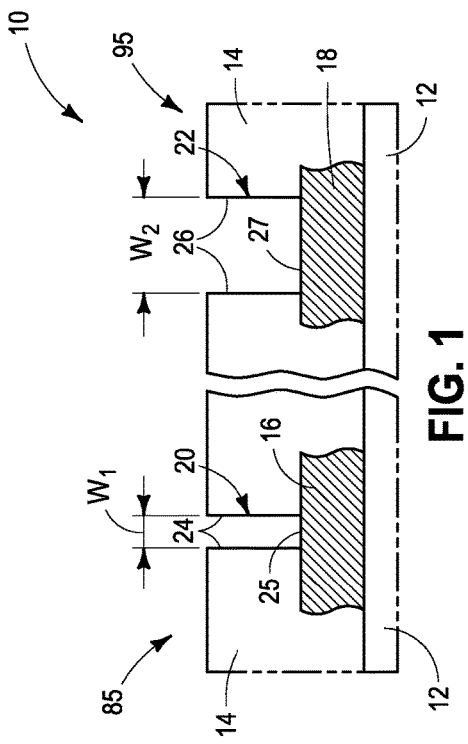
FIG. 1 is a diagrammatic sectional view of a substrate fragment in process in accordance with an embodiment of the invention, and is taken through line 1-1 in FIG. 2.

Method embodiments are initially described starting with respect to an example substrate fragment 10 in FIGS. 1 and 2, and which comprises a base substrate 12 which may be a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Materials may be aside, elevationally inward, or elevationally outward of the FIGS. 1 and 2—depicted materials. For example, other partially or wholly fabricated components of integrated circuitry may be provided somewhere about or within fragment 10. Further, by way of example only, substrate fragment 10 is shown as comprising portions of two regions 85 and 95, for example a memory array region 85 and a peripheral circuitry region 95 comprising control and/or logic circuitry to read from and write to memory cells within memory array region 85.

Substrate 12 may comprise any one or more of conductive (i.e., electrically herein), semiconductive, or insulative (i.e., electrically herein) materials. In the context of this document, a conductor/conductive material has compositional intrinsic electrical conductivity of at least 1 siemen/cm (i.e., at 20° C. everywhere herein) as opposed to electrical conductivity that could occur by movement of positive or negative charges through a thin material that is otherwise intrinsically insulative. An insulator/insulative/dielectric material has compositional intrinsic electrical conductivity of no greater than $1\times10^{-10}$ siemen/cm (i.e., it is electrically resistive as opposed to being conductive or semiconductive). Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Substrate 10 may comprise elevationally inner components (contrasted with elevationally outer substrate components described subsequently), with example first component 16 and second component 18 being shown. The circuit components referred to herein may be any existing or yet-to-be-developed components of integrated circuitry. Components 16 and 18 are shown as portions of two conductive lines that have been formed over base substrate 12, and as being at the same elevation but need not to be so. Dielectric material 14 has been formed over substrate 12 and first and second circuit components 16 and 18, with silicon nitride and doped or undoped silicon dioxide being examples.

A first via opening 20 and a second via opening 22 are formed within dielectric material 14. In one embodiment, first via opening 20 extends elevationally inward to first elevationally inner circuit component 16 and second via opening 22 extends elevationally inward to second elevationally inner circuit component 18. First via opening 20 has sidewalls 24 and a base 25, and second via opening 22 has sidewalls 26 and a base 27. In one embodiment and as shown, first via opening 20 has a smaller minimum open horizontal width $W_1$ than a minimum open horizontal width $W_2$ of second via opening 22. In this document, "horizontal" refers to a general direction along a primary surface (i.e., within 10 degrees) relative to which the substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "upper", "lower", "top", "bottom", and "beneath" are generally with reference to the vertical direction relative to a base substrate upon which the circuitry is fabricated. An example width $W_1$ is about 200 Angstroms, and an example width $W_2$ is about 1,000 Angstroms. Via openings 20 and 22 are shown as being circular in horizontal cross section, although any non-circular configurations may be used. An example technique for forming via openings 20 and 22 includes photolithographic patterning and subtractive etch of material 14 conducted selectively relative to material of circuit components 16, 18. Pitch multiplication may be used. FIGS. 1 and 2 show but one example of forming a first via opening 20 and a second via opening 22 within a substrate 10 (i.e., regardless of whether into material 14, regardless of whether material 14 is dielectric, regardless of presence of or extending to any elevationally inner circuit components, and regardless of different relative sizes and/or shapes of the via openings).

Figure 3:
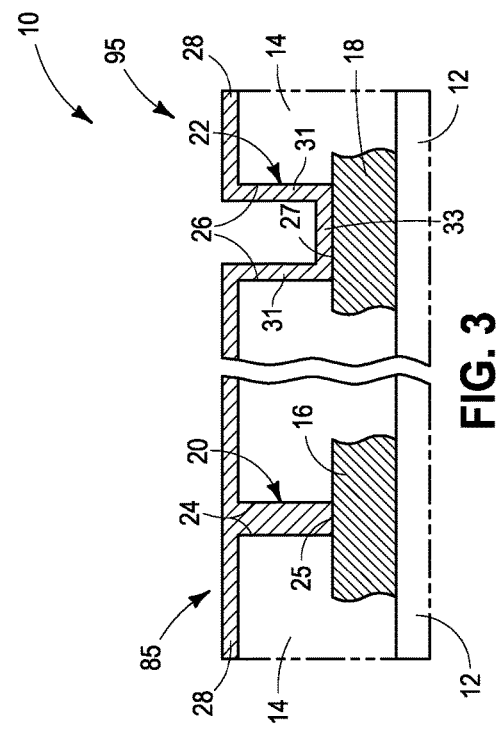
FIG. 3 is a view of the FIG. 1 substrate at a processing step subsequent to that shown by FIGS. 1 and 2.

Referring to FIG. 3, first conductive material 28 of a first conductivity is formed into first via opening 20 and second via opening 22. First conductive material 28 lines sidewalls 26 and base 27 of second via opening 22 to less-than-fill second via opening 22, and may be considered as comprising sidewalls 31 and a base 33. Any suitable conductive material(s) may be used, with elemental metals, an alloy or mixture of two or more elemental metals, conductive metal compounds, and conductively doped semiconductive material being examples. By way of examples only, some specific suitable first conductive materials are TiN, TaN, and $RuO_x$. In one embodiment, the first conductivity is no less than about 1,000 siemens/cm and no greater than about 50,000 siemens/cm.

In one embodiment and as shown, first conductive material 28 overfills first via opening 20 with first conductive material 28. First conductive material 28 may be formed to a thickness that is at least half the maximum open horizontal width of first via opening 20 to achieve such. An example thickness for first conductive material 28 is about 120 Angstroms to about 200 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials and regions described herein may be of substantially constant thickness or of variable thickness. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physically touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

In one embodiment, first conductive material 28 as initially-formed electrically couples to respective first and second elevationally inner circuit components 16 and 18. In one such embodiment and as shown, first conductive material 28 as initially-formed extends outwardly of the first and second via openings elevationally over dielectric material 14 and electrically couples first elevationally inner circuit component 16 and second elevationally inner circuit component 18 together. In the context of this document, devices/materials/components are electrically coupled relative one another if in normal operation electric current is capable of continuously flowing from one to the other, and does so predominately by movement of subatomic positive and/or negative charges when such are sufficiently generated.

Figure 4:
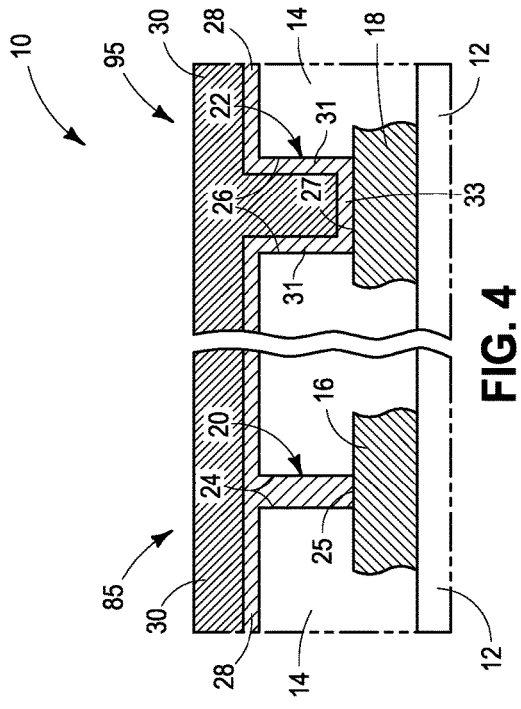
FIG. 4 is a view of the FIG. 3 substrate at a processing step subsequent to that shown by FIG. 3.

Referring to FIG. 4, second conductive material 30 is formed into second via opening 22 over, and in one embodiment directly against, first conductive material 28 in second via opening 22. Second conductive material 30 is of a second conductivity that is greater than the first conductivity. In one embodiment, the second conductivity is at least 50,000 siemens/cm greater than the first conductivity. Any suitable conductive material(s) may be used, with elemental metals, an alloy or mixture of two or more elemental metals, conductive metal compounds, and conductively doped semiconductive material being examples. By way of examples only, some specific suitable second conductive materials are W, Cu, and Al. In one embodiment and as shown, second conductive material 30 is not formed into first via opening 20, and in one embodiment is never formed into first via opening 20. In one embodiment and as shown, second conductive material 30 overfills the volume of second via opening 22 that remains after the forming of first conductive material 28. In one embodiment and as shown, second conductive material 30 extends outwardly of the first and second via openings elevationally over first conductive material 28 and dielectric material 14.

Referring to FIGS. 5 and 6, first conductive material 28 and second conductive material 30 are removed from being elevationally over dielectric material 14 and from electrically coupling first circuit component 16 and second circuit component 18 together. Example techniques for doing so include chemical-mechanical polishing and resist etch-back. Some of dielectric material 14 may be removed (not shown). FIGS. 5 and 6 show formation of a first conductive via 35 in first via opening 20 and of a second conductive via 45 in second via opening 22. All conductive material within first via opening 20 forms first conductive via 35 to define or have a first maximum conductance elevationally through first conductive via 35. All conductive material within second via opening 22 forms second conductive via 45 to define or have a second maximum conductance elevationally through second via 45 that is greater than the first maximum conductance. In one embodiment, the first conductive via is devoid of the second conductive material. In one embodiment, the first conductive via consists essentially of the first conductive material.

For example, FIG. 5 shows second conductive via 45 having a current path 34 and first conductive via 35 having a current path 36. Current paths 34 and 36, respectively, are the shortest most-conductive paths through their respective vias, with current path 34 being of greater conductance because of greater amount of higher conductive material (e.g., second conductive material 30) in comparison to first conductive material 28. Conductive path 36 is shown as only constituting first conductive material 28. In one embodiment, first conductive via 35 and second conductive via 45 are formed to have about the same elevational thickness (i.e., no greater than a 10% difference in elevational thickness). In one embodiment, first conductive via 35 and second conductive via 45 are individually formed to have a planar elevationally outermost surface and which together are coplanar. In one embodiment, the first conductive via is formed to have the first maximum conductance be no greater than about 200 microsiemens, and in one embodiment to be no less than about 100 microsiemens. In one embodiment, the second conductive via is formed to have the second maximum conductance be at least about 10,000 microsiemens.

Referring to FIG. 7, a first elevationally outer circuit component 40 is formed to electrically couple to first conductive via 35 and a second elevationally outer circuit component 44 is formed to electrically couple to second conductive via 45. Again by way of example only, elevationally outer circuit components 40 and 44 are shown as being conductive lines, for example being elongated into and out of the plane of the page upon which FIG. 7 lies. Components 40 and 44 are shown as being at the same elevation but need not to be so. By way of example only and in accordance with a problem or issue which motivated the invention as described in the "Background" section above, first elevationally outer circuit component 40 comprises an access line or a sense line of an array of cross-point memory cells. Lines 38 and 42 (e.g., other elevationally outer circuit components) are also shown as having been formed, and may be of the same type as line 40 (i.e., an access line or a sense line). Conductive vias (not shown) would connect lines 38 and 42 to other respective elevationally inner circuit components (not shown) likely out of the plane of the page upon which FIG. 7 lies, and ideally would be of the same construction/composition as that of first conductive via 35. More than one conductive via (not shown) may electrically couple with an individual line 38, 40, and/or 42. Providing lower maximum conductance vias within a memory array as compared to within peripheral circuitry may improve circuitry performance at least during write operations.

Conductive line 48 is an example other of an access line or a sense line (i.e., in comparison to lines 38, 40, and 42 each being the one of an access line or a sense line). Materials/components 50, 52 are between a respective crossing access line and sense line, with such respectively comprising one of programmable material (e.g., resistance-variable, ferroelectric, chalcogenide, phase change, memristive, etc.) and a select device (e.g., a diode), with example individual cross-point memory cells being represented by individual dashed outlines 46. Any existing or yet-to-be-developed programmable materials and select devices may be used. Second elevationally outer circuit component 44 may comprise a portion of cross-point memory cell read/write circuitry peripheral to array region 85, and whether such circuitry is existing or yet-to-be-developed. However, method and structural aspects as disclosed and claimed herein encompass methods of forming conductive vias and encompass integrated circuit structures comprising conductive vias other than in any type of cross-point memory and other than in memory circuitry.

Additional example methods of forming conductive vias in accordance with embodiments of the invention are next described with reference to FIGS. 8-14 with respect to a substrate 10a. Like numerals from the above-described embodiments have been used where appropriate, with some construction differences being indicated with the suffix "a" or with different numerals. FIG. 8 shows example alternate processing to that shown by FIG. 3. First conductive material 28a is formed thinner than material 28 in the first embodiments to only line sidewalls 24 and base 25 of first via opening 20 (i.e., to less-than-fill first via opening 20 with first conductive material 28*a*), and may be considered as comprising sidewalls 41 and a base 43.

Figure 9:
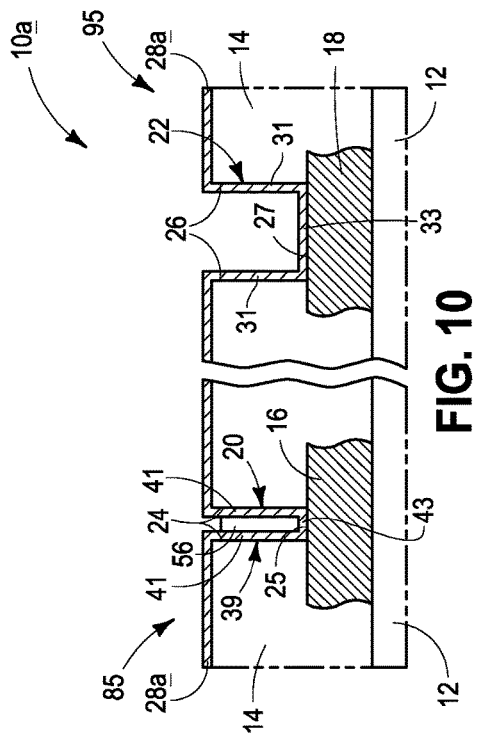
FIG. 9 is a view of the FIG. 8 substrate at a processing step subsequent to that shown by FIG. 8.

Referring to FIG. 9, fill material 56 is formed into first via opening 20 and second via opening 22 over first conductive material 28*a*, and in one embodiment directly there-against, to overfill the volume of first via opening 20 remaining after the forming of first conductive material 28*a*. Fill material 56 lines sidewalls 31 and base 33 of first conductive material 28*a* in second via opening 22 to less-than-fill volume of second via opening 22 remaining after the forming of first conductive material 28*a*. In one embodiment and as shown, fill material 56 extends outwardly of first and second via openings 20, 22 elevationally over, and in one embodiment directly against, first conductive material 28*a* and elevationally over dielectric material 14.

Fill material 56 is of lower conductivity than the second conductivity. In one embodiment, fill material 56 is of lower conductivity than the first conductivity. In one such embodiment, the fill material is not conductive, and in one such embodiment is semiconductive. In one ideal embodiment, the fill material is insulative. However in another embodiment, the fill material is conductive. Example insulative fill materials include silicon nitride and silicon dioxide. Example semiconductive fill materials include suitably doped monocrystalline silicon and polysilicon, and example conductive fill materials include any of the conductive materials referred to herein at least where fill material 56 is of lower conductivity than the second conductivity (i.e., that of the second conductive material referred to above and below).

Figure 10:
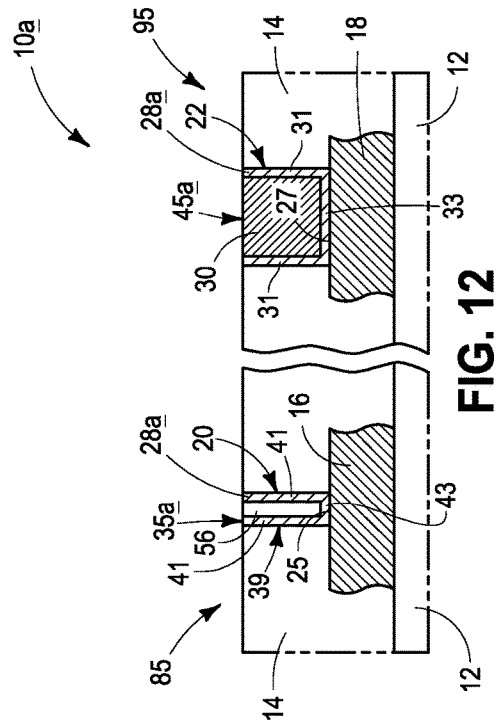
FIG. 10 is a view of the FIG. 9 substrate at a processing step subsequent to that shown by FIG. 9.

Referring to FIG. 10, fill material 56 is removed to expose base 33 of first conductive material 28*a* within second via opening 22, and in one embodiment as shown to remove all such fill material 56 from being within second via opening 22. Example techniques for doing so include timed isotropic dry etching and timed isotropic wet etching of fill material 56 selectively relative to first conductive material 28*a*. Also in one embodiment and as shown, such act of removing may recess fill material 56 within first via opening 20 (e.g., from an elevationally outermost surface of dielectric material 14 within which first via opening 20 is formed). Regardless and in one embodiment as shown, the depicted act of removing fill material 56 also has removed it from being elevationally over dielectric material 14.

Figure 11:
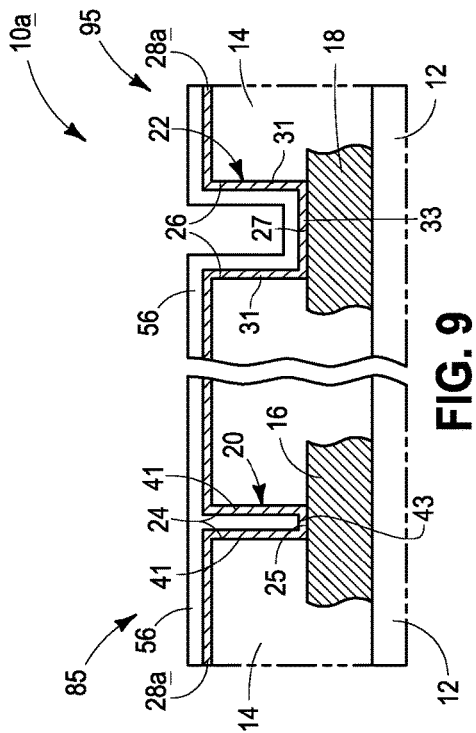
FIG. 11 is a view of the FIG. 10 substrate at a processing step subsequent to that shown by FIG. 10.

Referring to FIG. 11, second conductive material 30 is formed into second via opening 22, and in one embodiment as shown overfills the volume of second via opening 22 remaining after the forming and the removing of fill material 56. Also where, for example, the depicted FIG. 10—removing of fill material 56 recesses fill material 56 within first via opening 20, some second conductive material 30 may form into first via opening 20 over fill material 56 as shown.

Figure 12:
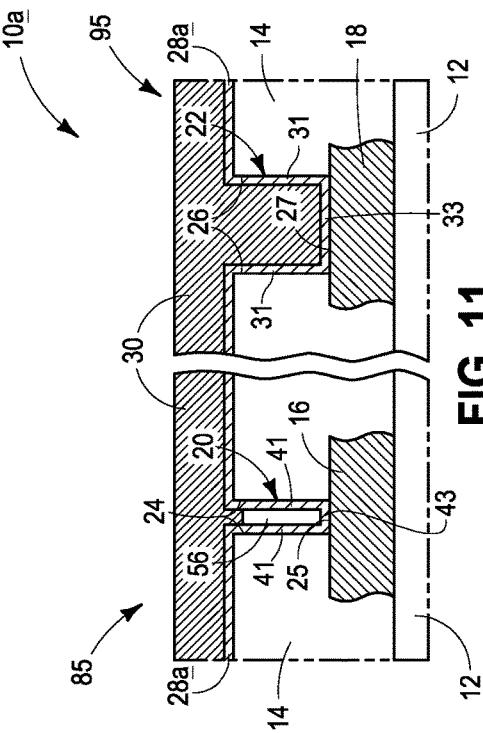
FIG. 12 is a view of the FIG. 11 substrate at a processing step subsequent to that shown by FIG. 11, and is taken through line 12-12 in FIG. 13.

Referring to FIGS. 12 and 13, second conductive material 30 and first conductive material 28*a* are removed from being elevationally over dielectric material 14, thereby forming first conductive via 35*a* and second conductive via 45*a*. In one embodiment and as shown, such forms first conductive via 35*a* to comprise a cylinder 39 of first conductive material 28*a* encircling fill material 56. Second conductive via 45*a* may have a greater maximum elevational conductance than second via 45 due to a thinner first conductive material base 33 compared to base 31. Some of dielectric material 14 is also shown as being removed, as is all remaining second conductive material 30 from first via opening 20. Alternately, some second conductive material 30 may remain (not shown) in first via opening 20 (e.g., a lower volume of material 30 in first via opening 20 than in second vial opening 22).

FIG. 14 shows subsequent processing analogous to that shown and described above with respect to FIG. 7. Any other attribute(s) or aspect(s) as shown and/or described above may be used.

FIG. 10 shows an example embodiment wherein all of fill material 56 is removed from within second via opening 22 before forming second conductive material 30. Alternate example embodiments in accordance with the invention are next described with reference to FIGS. 15-18 and a substrate fragment 10*b*. Like numerals from the above-described embodiments have been used where appropriate, with some construction differences being indicated with the suffix "b". FIG. 15 shows alternate processing to that of FIG. 10 wherein the removing of fill material 56 leaves fill material 56 laterally over sidewalls 31 of first conductive material 28*a* within second via opening 22. Such a structure may result, for example, by conducting a dry anisotropic etch of fill material 56 selectively relative to first conductive material 28*a*.

Figure 18:
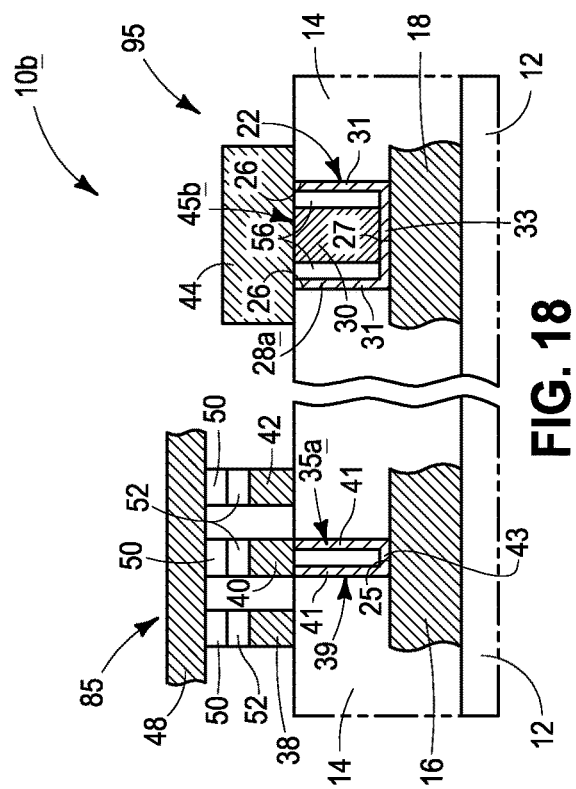
FIG. 18 is a view of the FIG. 17 substrate at a processing step subsequent to that shown by FIG. 17.
Figure 17:
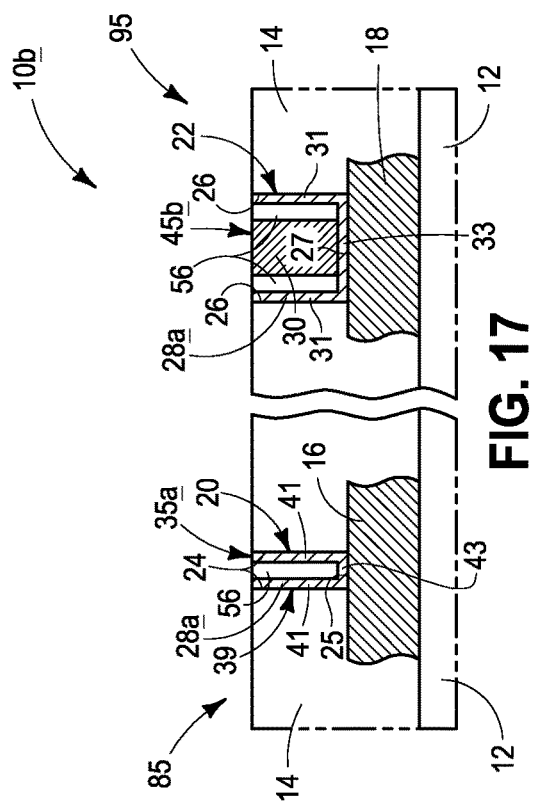
FIG. 17 is a view of the FIG. 16 substrate at a processing step subsequent to that shown by FIG. 16.

FIGS. 16-18 show subsequent processing analogous to that of FIGS. 11-14 whereby fill material 56 remains within second conductive via opening 22 in a finished circuitry construction incorporating first conductive via 35*a* and a second conductive via 45*b*. Any other attribute(s) or aspect(s) as shown and/or described above may be used.

Embodiments of the invention encompass integrated circuit structures independent of method of manufacture. An example such embodiment includes a substrate (e.g., substrate 10/10*a*/10*b*) comprising elevationally outer circuit components (e.g., components 38, 40, 42, and 44) and elevationally inner circuit components (e.g., components 16 and 18). A first conductive via (e.g., via 35/35*a*) electrically couples at least one of the elevationally outer circuit components (e.g., component 40) with at least one of the elevationally inner circuit component (e.g., component 16). The first conductive via comprises a first conductive material (e.g., material 28/28*a*) of a first conductivity. A second conductive via (e.g., via 45/45*a*/45*b*) electrically couples at least one other of the elevationally outer circuit components (e.g., component 44) with at least one other of the elevationally inner circuit components (e.g., component 18). The second conductive via comprises a radially outer lining (e.g., a lining/sidewalls 31) comprising the first conductive material and a radially inner second conductive material (e.g., material 30) of a second conductivity that is greater than the first conductivity. The first conductive via defines or has a first maximum conductance elevationally through the first conductive via and the second conductive via defines or has a second maximum conductance elevationally through the second conductive via that is greater than the first maximum conductance. Any other attribute(s) or aspect(s) as described above with respect to the method embodiments may be used or incorporated in structure embodiments.

Another example structure embodiment in accordance with the invention includes a substrate (e.g., substrate 10/10*a*/10*b*) comprising elevationally outer circuit components (e.g., components 38, 40, 42, and 44) and elevationally inner circuit components (e.g., components 16 and 18). A first conductive via (e.g., via 35/35*a*) electrically couples at least one of the elevationally outer circuit components (e.g., component 40) with at least one of the elevationally inner circuit components (e.g., component 16). The first conductive via comprises first conductive material (e.g., material 28/28*a*) of a first conductivity. A second conductive via (e.g., via 45/45a/45b) electrically couples at least one other of the elevationally outer circuit components (e.g., component 44) with at least one other of the elevationally inner circuit components (e.g., component 18). The second conductive via comprises the first conductive material in an upwardly-open container shape having a first conductive material base (e.g., base 33) elevationally over the at least one other elevationally inner circuit component and having encircling first conductive material sidewalls (e.g., sidewalls 31) extending upwardly from the first conductive material base. The second conductive via comprises second conductive material (e.g., material 30) radially inward of the first conductive material sidewalls and elevationally over the first conductive material base. The second conductive material is of a second conductivity that is greater than the first conductivity. The second conductive via has a larger minimum horizontal width than the first conductive via. The first conductive via is devoid of the second conductive material and defines or has a first maximum conductance elevationally through the first conductive via. The second conductive via defines or has a second maximum conductance elevationally through the second conductive via that is greater than the first maximum conductance. Any other attribute(s) or aspect(s) as shown and/or described above may be used.

Another example structure embodiment in accordance with the invention includes a substrate (e.g., substrate 10a/10b) comprising elevationally outer circuit components (e.g., components 38, 40, 42, and 44) and elevationally inner circuit components (e.g., components 16 and 18). A first conductive via (e.g., via 35a) electrically couples at least one of the elevationally outer circuit components (e.g., component 40) with at least one of the elevationally inner circuit components (e.g., component 16). The first conductive via comprises first conductive material (e.g., material 28a) of a first conductivity. The first conductive material is in an upwardly-open container shape having a first conductive material base (e.g., base 43) elevationally over the at least one elevationally inner circuit component and having encircling first conductive material sidewalls (e.g., sidewalls 41) extending upwardly from the first conductive via base. Another material (e.g., material 56) of different composition from that of the first conductive material is radially inward of the first conductive via sidewall (e.g., sidewalls 31) and elevationally over the first conductive via base (e.g., base 43). A second conductive via (e.g., via 45a/45b) electrically couples at least one other of the elevationally outer circuit components (e.g., component 44) with at least one other of the elevationally inner circuit components (e.g., component 18). The second conductive via comprises the first conductive material in an upwardly-open container shape having a first conductive material base (e.g., base 33) elevationally over the at least one other elevationally inner circuit component and having encircling first conductive material sidewalls (e.g., sidewalls 31) extending upwardly from the second via base. The second conductive via comprises second conductive material (e.g., material 30) radially inward of the second conductive via sidewalls and elevationally over the second conductive via base. The second conductive material is of a second conductivity that is greater than the first conductivity. The another material (e.g., material 56) has lower conductivity than the second conductivity. The second conductive via has a larger minimum horizontal width than the first conductive via. The first conductive via defines or has a first maximum conductance elevationally through the first conductive via. The second conductive via defines or has a second maximum conductance elevationally through the second conductive via that is greater than the first maximum conductance. Any other attribute(s) or aspect(s) as shown and/or described above may be used.

CONCLUSION

In some embodiments, a method of forming conductive vias comprises forming a first via opening and a second via opening within a substrate. First conductive material of a first conductivity is formed into the first and second via openings. The first conductive material lines sidewalls and a base of the second via opening to less-than-fill the second via opening. Second conductive material is formed into the second via opening over the first conductive material in the second via opening. The second conductive material is of a second conductivity that is greater than the first conductivity. All conductive material within the first via opening forms a first conductive via defining a first maximum conductance elevationally through the first conductive via and all conductive material within the second via opening forms a second conductive via defining a second maximum conductance elevationally through the second conductive via that is greater than said first maximum conductance.

In some embodiments, a method of forming conductive vias comprises forming a first via opening and a second via opening within dielectric material. The first via opening has a smaller minimum open horizontal width than the second via opening. The first via opening extends elevationally inward to a first elevationally inner circuit component. The second via opening extends elevationally inward to a second elevationally inner circuit component. First conductive material of a first conductivity is formed into the first and second via openings and electrically couples to the first and second elevationally inner circuit components. The first conductive material overfills the first via opening. The first conductive material lines sidewalls and a base of the second via opening to less-than-fill the second via opening. The first conductive material extends outwardly of the first and second via openings elevationally over the dielectric material and electrically couples the first and second elevationally inner circuit components together. Second conductive material is formed into the second via opening but not into the first via opening. The second conductive material is of a second conductivity that is greater than the first conductivity and overfills volume of the second via opening remaining after the forming of the first conductive material. The second conductive material extends outwardly of the first and second via openings elevationally over and directly against the first conductive material and elevationally over the dielectric material. The first and second conductive materials are removed from being elevationally over the dielectric material and from electrically coupling the first and second elevationally inner circuit components together. A first conductive via is formed in the first via opening and a second conductive via is formed in the second via opening. All conductive material of the first conductive via defines a first maximum conductance elevationally through the first conductive via to the first elevationally inner circuit component. All conductive material of the second conductive via defines a second maximum conductance elevationally through the second conductive via to the second elevationally inner circuit component. The second maximum conductance is greater than the first maximum conductance. A first elevationally outer circuit component is formed to electrically couple to the first conductive via and a second elevationally outer circuit component is formed electrically coupled to the second conductive via.

In some embodiments, a method of forming conductive vias comprises forming a first via opening and a second via opening within dielectric material. The first via opening has a smaller minimum open horizontal width than the second via opening. The first via opening extends elevationally inward to a first elevationally inner circuit component. The second via opening extends elevationally inward to a second elevationally inner circuit component. First conductive material of a first conductivity is formed into the first and second via openings and electrically couples to the first and second elevationally inner circuit components. The first conductive material lines sidewalls and a base of the first via opening to less-than-fill the first via opening. The first conductive material lines sidewalls and a base of the second via opening to less-than-fill the second via opening. The first conductive material extends outwardly of the first and second via openings elevationally over the dielectric material. Fill material is formed into the first and second via openings over the first conductive material. The fill material overfills volume of the first via opening remaining after the forming of the first conductive material. The fill material lines sidewalls and a base of the first conductive material in the second via opening to less-than-fill volume of the second via opening remaining after the forming of the first conductive material. The fill material extends outwardly of the first and second via openings elevationally over the first conductive material and elevationally over the dielectric material. The fill material is removed to expose the base of the first conductive material within the second via opening. Second conductive material is formed into the second via opening. The second conductive material is of a second conductivity that is greater than the first conductivity and overfills volume of the second via opening remaining after the forming of the fill material. The second conductive material extends outwardly of the first and second via openings elevationally over the first conductive material and the dielectric material. The fill material is of lower conductivity than the second conductivity. The second conductive material is removed from being elevationally over the dielectric material. A first conductive via is formed in the first via opening and a second conductive via is formed in the second via opening. All conductive material of the first conductive via defines a first maximum conductance elevationally through the first conductive via to the first elevationally inner circuit component. All conductive material of the second conductive via defines a second maximum conductance elevationally through the second conductive via to the second elevationally inner circuit component. The second maximum conductance is greater than the first maximum conductance. A first elevationally outer circuit component is formed to electrically couple to the first conductive via and a second elevationally outer circuit component is formed to electrically couple to the second conductive via.

In some embodiments, an integrated circuit structure comprises a substrate comprising elevationally outer circuit components and elevationally inner circuit components. A first conductive via electrically couples at least one of the elevationally outer circuit components with at least one of the elevationally inner circuit components. The first conductive via comprises first conductive material of a first conductivity. A second conductive via electrically couples at least one other of the elevationally outer circuit components with at least one other of the elevationally inner circuit components. The second conductive via comprises a radially outer lining comprising the first conductive material and a radially inner second conductive material of a second conductivity that is greater than the first conductivity. The first conductive via defines a first maximum conductance elevationally through the first conductive via and the second conductive via defines a second maximum conductance elevationally through the second conductive via that is greater than said first maximum conductance.

In some embodiments, an integrated circuit structure comprises a substrate comprising elevationally outer circuit components and elevationally inner circuit components. A first conductive via electrically couples at least one of the elevationally outer circuit components with at least one of the elevationally inner circuit components. The first conductive via comprises first conductive material of a first conductivity. A second conductive via electrically couples at least one other of the elevationally outer circuit components with at least one other of the elevationally inner circuit components. The second conductive via comprises the first conductive material in an upwardly-open container shape having a first conductive material base elevationally over the at least one other elevationally inner circuit component and has encircling first conductive material sidewalls extending upwardly from the first conductive material base. The second conductive via comprises second conductive material radially inward of the first conductive material sidewalls and elevationally over the first conductive material base. The second conductive material is of a second conductivity that is greater than the first conductivity. The second conductive via has a larger minimum horizontal width than the first conductive via. The first conductive via is devoid of the second conductive material and defines a first maximum conductance elevationally through the first conductive via. The second conductive via defines a second maximum conductance elevationally through the second conductive via that is greater than said first maximum conductance.

In some embodiments, an integrated circuit structure comprises a substrate comprising elevationally outer circuit components and elevationally inner circuit components. A first conductive via electrically couples at least one of the elevationally outer circuit components with at least one of the elevationally inner circuit components. The first conductive via comprises first conductive material of a first conductivity. The first conductive material is in an upwardly-open container shape having a first conductive material base elevationally over the at least one elevationally inner circuit component and having encircling first conductive material sidewalls extending upwardly from the first conductive via base. Another material of different composition from that of the first conductive material radially inward of the first conductive via sidewalls and elevationally over the first conductive via base. A second conductive via electrically couples at least one other of the elevationally outer circuit components with at least one other of the elevationally inner circuit components. The second conductive via comprises the first conductive material in an upwardly-open container shape having a first conductive material base elevationally over the at least one other elevationally inner circuit component and having encircling first conductive material sidewalls extending upwardly from the second via base. The second conductive via comprises second conductive material radially inward of the second conductive via sidewalls and elevationally over the second conductive via base. The second conductive material is of a second conductivity that is greater than the first conductivity. The another material having lower conductivity than the second conductivity. The second conductive via has a larger minimum horizontal width than the first conductive via. The first conductive via defines a first maximum conductance elevationally through the first conductive via. The second conductive via defines a second maximum conductance elevationally through the second conductive via that is greater than said first maximum conductance.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming conductive vias, comprising:
   forming a first via opening and a second via opening within a substrate;
   forming first conductive material of a first conductivity into the first and second via openings, the first conductive material lining sidewalls and a base of the second via opening to less-than-fill the second via opening, the forming of the first conductive material forming the first conductive material to line sidewalls and a base of the first via opening to less-than-fill the first via opening with the first conductive material;
   forming second conductive material into the second via opening over the first conductive material in the second via opening, the second conductive material being of a second conductivity that is greater than the first conductivity; and
   all conductive material within the first via opening forming a first conductive via defining a first maximum conductance elevationally through the first conductive via and all conductive material within the second via opening forming a second conductive via defining a second maximum conductance elevationally through the second conductive via that is greater than said first maximum conductance.

2. The method of claim 1 wherein the first conductivity is no less than about 1,000 siemens/cm and no greater than about 50,000 siemens/cm.

3. The method of claim 1 wherein the second conductivity is at least 50,000 siemens/cm greater than the first conductivity.

4. The method of claim 1 comprising forming the first conductive via to have the first maximum conductance be no greater than about 200 microsiemens, the first maximum conductance be no less than about 100 microsiemens, and forming the second conductive via to have the second maximum conductance be at least about 10,000 microsiemens.

5. The method of claim 1 comprising forming the first via opening to have a smaller minimum open horizontal width than the second via opening.

6. The method of claim 1 wherein the forming of the first conductive material overfills the first via opening with first conductive material.

7. The method of claim 1 wherein no second conductive material is ever formed into the first via opening.

8. The method of claim 1 comprising forming fill material into the first and second via openings over the first conductive material, the fill material overfilling volume of the first via opening remaining after the forming of the first conductive material, the fill material lining sidewalls and a base of the first conductive material in the second via opening to less-than-fill volume of the second via opening remaining after the forming of the first conductive material.

9. The method of claim 8 comprising forming the first conductive via to comprise a cylinder of first conductive material encircling the fill material.

10. The method of claim 8 comprising forming the fill material to be insulative.

11. The method of claim 8 comprising forming the fill material to be semiconductive.

12. The method of claim 8 comprising forming the fill material to be conductive.

13. The method of claim 8 comprising forming the fill material to be of lower conductivity than the second conductivity.

14. The method of claim 1 wherein the first and second conductive vias are formed to individually have a planar elevationally outermost surface and which together are coplanar.

* * * * *